(12) United States Patent
Inazuki et al.

(10) Patent No.: US 8,148,036 B2
(45) Date of Patent: Apr. 3, 2012

(54) PHOTOMASK BLANK AND PHOTOMASK

(75) Inventors: Yukio Inazuki, Joetsu (JP); Hideo Kaneko, Joetsu (JP); Hiroki Yoshikawa, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 211 days.

(21) Appl. No.: 12/750,044

(22) Filed: Mar. 30, 2010

(65) Prior Publication Data

US 2010/0248090 A1 Sep. 30, 2010

(30) Foreign Application Priority Data

Mar. 31, 2009 (JP) .................................. 2009-86145

(51) Int. Cl.
*G03F 1/00* (2006.01)
*G03C 5/00* (2006.01)
(52) U.S. Cl. ............................................ 430/5; 430/323
(58) Field of Classification Search .............. 430/5, 322, 430/323, 324, 311, 312; 378/35
See application file for complete search history.

(56) References Cited

U.S. PATENT DOCUMENTS

| 6,368,752 B1 * | 4/2002 | Dauksher et al. ................. 430/5 |
| 6,746,806 B2 | 6/2004 | Nozawa |
| 7,195,846 B2 | 3/2007 | Kaneko et al. |
| 2007/0020534 A1 | 1/2007 | Yoshikawa et al. |
| 2007/0023390 A1 | 2/2007 | Kumar |
| 2007/0212619 A1 | 9/2007 | Yoshikawa et al. |
| 2009/0035880 A1 | 2/2009 | Itoh |
| 2009/0246647 A1 | 10/2009 | Hashimoto et al. |

FOREIGN PATENT DOCUMENTS

| EP | 1 746 460 A2 | 1/2007 |
| EP | 1 832 926 A2 | 9/2007 |
| JP | 2002-229183 A | 8/2002 |
| JP | 2003-50458 A | 2/2003 |
| JP | 2004-199035 A | 7/2004 |
| JP | 2006-195202 A | 7/2006 |
| JP | 2007-241060 A | 9/2007 |

OTHER PUBLICATIONS

EPO European Search Report, Appl. No. 10003481.8, Nov. 12, 2010, pp. 1-9.
Borodovsky, Y., "Marching to the beat of Moore's Law", Proceedings of SPIE, vol. 6153, 615301-1 to 19, 2006.

* cited by examiner

Primary Examiner — Stephen Rosasco
(74) Attorney, Agent, or Firm — Birch, Stewart, Kolasch & Birch, LLP

(57) ABSTRACT

A photomask blank comprises a transparent substrate, a light-shielding film of an optionally transition metal-containing silicon material, and an etching mask film of a chromium compound base material. The etching mask film consists of multiple layers of different composition which are deposited by reactive sputtering, the multiple layers including, in combination, a first layer of a material which imparts a compression stress when deposited on the substrate as a single composition layer and a second layer of a material which imparts a tensile stress when deposited on the substrate as a single composition layer.

4 Claims, 2 Drawing Sheets

PHOTOMASK BLANK AND PHOTOMASK

CROSS-REFERENCE TO RELATED APPLICATION

This non-provisional application claims priority under 35 U.S.C. §119(a) on Patent Application No. 2009-086145 filed in Japan on Mar. 31, 2009, the entire contents of which are hereby incorporated by reference.

TECHNICAL FIELD

This invention relates to photomask blanks and photomasks fabricated therefrom, the photomasks being used in the lithographic manufacture of semiconductor integrated circuits, charge-coupled devices (CDD), liquid crystal display (LCD) color filters, magnetic heads or the like.

BACKGROUND ART

In the recent semiconductor processing technology, a challenge to higher integration of large-scale integrated circuits places an increasing demand for miniaturization of circuit patterns. There are increasing demands for further reduction in size of circuit-constructing wiring patterns and for miniaturization of contact hole patterns for cell-constructing interlayer connections. As a consequence, the manufacture of circuit pattern-written photomasks for use in the photolithography for forming such wiring patterns and contact hole patterns needs a technique capable of accurately writing finer circuit patterns in order to meet the miniaturization demand.

In forming a finer feature pattern, a resist film is exposed to a pattern of radiation using a photomask and an optical system. To project a pattern image onto the resist film at a high depth of focus, the substrate shape of the photomask must be controlled as reported in JP-A 2003-50458. It is pointed out that the photomask substrate must be selected such that the pattern-written surface of the photomask may maintain high flatness when the photomask is chucked to the mask stage of the exposure tool.

In the prior art, the flatness of photomask-forming transparent substrates and photomask blanks is regarded important. When an optical film such as a light-shielding film or phase shift film is deposited on a photomask-forming transparent substrate, the stress in the optical film is controlled so that the substrate shape may not be changed. Many techniques for controlling "sori" (warpage or bow), that is, shape change of the substrate surface are known, as described in JP-A 2002-229183 and JP-A 2004-199035.

Aside from the problem of substrate shape, the size control of a pattern of optical film such as a semiconductor circuitry pattern written on a photomask is also a problem. A higher degree of control is required as the desired pattern feature size is reduced. For example, in the manufacture of a photomask for use in producing a pattern having the minimum line width of up to 65 nm, especially up to 50 nm, a light-shielding film of chromium base material used in the prior art is difficult to control side etching during the etching step. Then the finish size may widely vary with a different density of a pattern to be written, known as the pattern density dependency or "proximity bias".

JP-A 2007-241060 describes that the problem of proximity bias can be mitigated by forming the light-shielding film from an optionally transition metal-containing silicon base material. The light-shielding film is processed while a very thin chromium base material serves as an etching mask. Using an optionally transition metal-containing silicon base material as the etching mask, a photomask which is size controlled at a very high accuracy can be manufactured.

The photomask for use in the lithography wherein a semiconductor circuit pattern has a minimum size of up to 45 nm requires a high degree of size control. When such a photomask is prepared using an optionally transition metal-containing silicon base material as the light-shielding film and a chromium base material as the etching mask film, the size control has little latitude.

In the manufacture of photomasks used in the lithography for forming a pattern having a minimum size of up to 45 nm, especially the lithography of which a higher accuracy of positional control is required as in the case of double patterning (Proceedings of SPIE, Vol. 6153, 615301-1 to 19 (2006)), the yield of photomask manufacture cannot be increased unless the photomask blank is provided with a reliability surpassing the currently available accuracy.

| Citation List | |
|---|---|
| Patent Document 1: | JP-A 2003-050458 |
| Patent Document 2: | JP-A 2002-229183 |
| Patent Document 3: | JP-A 2004-199035 |
| Patent Document 4: | JP-A 2007-241060 |
| | (US 2007212619, EP 1832926A2) |
| Patent Document 5: | JP-A 2006-195202 |
| Non-Patent Document 1: | Proceedings of SPIE, Vol. 6153, 615301-1 to 19 (2006) |

SUMMARY OF INVENTION

An object of the invention is to provide a photomask blank comprising a light-shielding film of an optionally transition metal-containing silicon compound and an etching mask film of a chromium base material, which offers a high processing latitude, that is, a higher dimensional control ability when processed into a photomask; and a photomask fabricated therefrom.

As discussed above, an appropriate shape control method is necessary for a photomask or photomask blank so that the photomask may not incur a degraded depth of focus on use. It has been a practice to use a less stressed film as the optical film such as a light-shielding film or phase shift film to avoid any shape change from occurring before and after processing of the photomask blank so that the photomask becomes unusable. For example, heating has long been practiced as effective means for tailoring an inorganic film deposited by sputtering. Heating at about 300° C. is effective for causing a change of warpage, but is difficult to reduce the stress to the desired level. Positive means for controlling film stress such as irradiation under a flash lamp are proposed as described, for example, in JP-A 2004-199035.

The etching masks discussed above includes an etching mask film of the type that is used for precise processing and is entirely stripped off until completion of a photomask. As used herein, the term "etching mask film" refers to an etching mask film of the type that is entirely stripped off until photomask completion. In the first place, the etching mask film is a thin film having a thickness of up to several tens of nanometers. It is used only in photomask processing, and does not exist at the time when the photomask is used in photolithography. It is believed to have no impact in the sense of shape change between the shape of a substrate prior to deposition of an etching mask film and the shape of a photomask at the completion stage. Thus little attention is paid to the stress of etching mask film.

In the fabrication of photomasks for use in the photolithography for printing a pattern size of up to 45 nm, especially photomasks for use in the double patterning version of photolithography, a higher accuracy of processing is not achievable unless the shape of a photomask blank is controlled during the lithography process used for the fabrication of photomasks, for example, upon exposure in an electron beam exposure tool.

Regarding a photomask blank comprising a rectangular transparent substrate, a light-shielding film of an optionally transition metal-containing silicon material deposited thereon, and an etching mask film of a chromium compound base material deposited on the light-shielding film for enabling precise processing of the light-shielding film, wherein the etching mask film is to be entirely stripped in any step until the photomask blank is processed into a photomask, the inventors have found that a photomask can be fabricated from the photomask blank at a high accuracy when the etching mask film consists of multiple layers of different compositions which are deposited by reactive sputtering, and the multiple layers include a first layer of a material which imparts a compression stress when deposited on the substrate as a single composition layer and a second layer of a material which imparts a tensile stress when deposited on the substrate as a single composition layer, which are combined such that the etching mask film may have a low stress as a whole.

The invention provides a photomask blank and photomask as defined below.

[1] A photomask blank comprising a rectangular transparent substrate, a light-shielding film of an optionally transition metal-containing silicon material deposited thereon, and an etching mask film of a chromium compound base material deposited on the light-shielding film for enabling precise processing of the light-shielding film, said etching mask film being to be entirely stripped in any step until the photomask blank is processed into a photomask, wherein said etching mask film consists of multiple layers of different composition which are deposited by reactive sputtering, the multiple layers including, in combination, a first layer of a material which imparts a compression stress when deposited on the substrate as a single composition layer and a second layer of a material which imparts a tensile stress when deposited on the substrate as a single composition layer.

[2] The photomask blank of [1] wherein the material which imparts a compression stress is an oxygen-containing chromium compound.

[3] The photomask blank of [1] wherein when a warpage change is determined by (1) measuring each of the outermost surface of the photomask blank prior to removal of the etching mask film and the outermost surface of the treated substrate after removal of the entire etching mask film, by a surface topography measuring device, obtaining XYZ three-dimensional coordinate data of each outermost surface, (2) computing a least square plane of each outermost surface from the coordinate data of each outermost surface, (3) while the relative position between the coordinates of the outermost surface of the photomask blank and the least square plane thereof, and the relative position between the coordinates of the outermost surface of the treated substrate and the least square plane thereof are fixed, arranging the coordinates and the least square plane such that (i) two least square planes are positioned on XY plane of a XYZ three-dimensional imaginary space, (ii) both the center of an outermost equivalent region of the photomask blank providing the former least square plane and the center of an outermost equivalent region of the treated substrate providing the latter least square plane are positioned at the origin, and (iii) the two outermost equivalent regions are arranged in overlay with their diagonal directions in alignment so that the four corners of the two outermost equivalent regions correspond to each other, respectively, before and after removal of the etching mask film, (4) within the range of the coordinate data arranged as above, for each pair of coordinates between the coordinates of the outermost surface of the photomask blank and the coordinates of the outermost surface of the treated substrate that are coincident in X and Y values, computing the difference ($Z_1 - Z_2$) between a Z value ($Z_1$) of the outermost surface of the photomask blank and a Z value ($Z_2$) of the outermost surface of the treated substrate, and (5) determining a sum of the magnitude of maximum and the magnitude of minimum of the difference ($Z_1 - Z_2$) of Z values that represents a warpage change, the warpage change is up to 50 nm/L/152 nm wherein L is the length (in mm) of a longer side of the transparent substrate.

[4] A photomask fabricated from the photomask blank of [1].

ADVANTAGEOUS EFFECTS OF INVENTION

Use of the photomask blank of the invention minimizes a change of surface topography before and after removal of the etching mask film by etching. When the photomask blank is processed into a photomask, the completed photomask is improved in pattern control.

DESCRIPTION OF EMBODIMENTS

Figure 1:
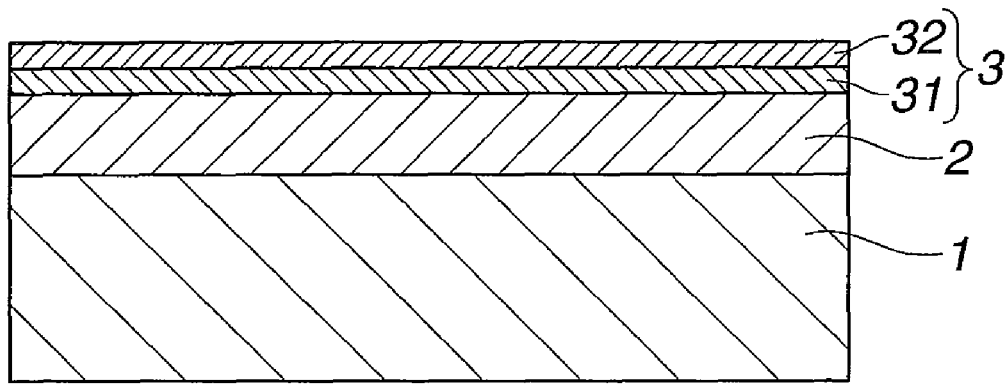
FIG. 1 is a cross-sectional view of a photomask blank in one embodiment of the invention.

The singular forms "a," "an" and "the" include plural referents unless the context clearly dictates otherwise. "Optional" or "optionally" means that the subsequently described event or circumstance may or may not occur, and that description includes instances where the event or circumstance occurs and instances where it does not. The terms "first," "second," and the like do not denote any order or importance, but rather are used to distinguish one element from another.

Photomasks for use in the photolithography for printing a pattern size of up to 65 nm, especially up to 45 nm, especially photomasks for use in the double patterning version of photolithography are required to have a very high mask accuracy. Accordingly, the processing of photomask blanks is also required to have a very high processing accuracy.

Once a photomask blank is manufactured from a photomask-forming transparent substrate, it is processed into a photomask. Given an optimum shape of the photomask, the shape of a photomask-forming transparent substrate is selected accordingly. A low stressed optical film is deposited thereon to construct a photomask blank. The optical film is then processed by etching, fabricating a photomask. The process ensures the production yield of photomasks.

However, to improve the reliability of a photomask blank comprising a light-shielding film of an optionally transition metal-containing silicon material and an etching mask film of a chromium base material, from which a photomask having a high accuracy is fabricated, a study must be made on the factor contributing to a further improvement in mask accuracy. The inventors attempted to improve the position accuracy of a pattern at the photomask processing stage.

With regard to deposition of optical films on photomask-forming transparent substrates, a number of proposals have been made to deposit a less stressed film, as described, for example, in JP-A 2002-229183 and JP-A 2004-199035. If a photomask blank is deformed when an optical film is deposited on a photomask-forming transparent substrate, then part of the stress is relieved in the step of removing a portion of the optical film in processing to form a mask pattern. Partial stress relief incurs secondary deformation of the substrate, failing to control the flatness of the photomask. If a transparent substrate having a specific shape to insure flatness when the photomask is chucked in an exposure tool is prepared and a less stressed optical film is deposited thereon, then general topographic conformity can be established among transparent substrate, photomask blank, and photomask.

As described above, the etching mask film is to be entirely stripped off at the time when the photomask is completed. A comparison of the stage prior to deposition of the etching mask film with the photomask completion stage after stripping of the film indicates that the stress of the etching mask film has no impact when only the transparent substrate and the optical film are considered. In addition, the etching mask film is as thin as several tens of nanometers or less. For these reasons, little attention was paid to the stress of the etching mask film.

However, the situation differs when attention is paid to the position accuracy of pattern writing in the stage of processing into a photomask. When an etching mask film is deposited on an optical film, this etching mask film causes sori (warpage or bow) to the photomask blank. If the etching mask film is removed after a resist pattern is formed on the photomask blank in the warped form and subsequent pattern processing is performed through the resist pattern, then the pattern position is shifted by that warpage. Then the invention attempts to control the stress of the etching mask film for achieving further improvements in accuracy.

The photomask blank of the invention comprises a transparent substrate of rectangular shape, especially square shape, a light-shielding film of an optionally transition metal-containing silicon material deposited thereon, and an etching mask film of a chromium compound base material deposited on the light-shielding film. The etching mask film is deposited for enabling precise processing of the light-shielding film and is to be entirely stripped off in any step until the photomask blank is processed into a photomask.

Referring to FIG. 1, one exemplary photomask blank is illustrated as comprising a transparent substrate 1, a light-shielding film 2 deposited thereon, and an etching mask film 3 deposited on the film 2. In the photomask blank of the invention, the etching mask film 3 consists of multiple layers of different composition, that is, two or more layers. In the embodiment illustrated in FIG. 1, the etching mask film 3 consists of two layers, a first layer 31 and a second layer 32.

Figure 2:
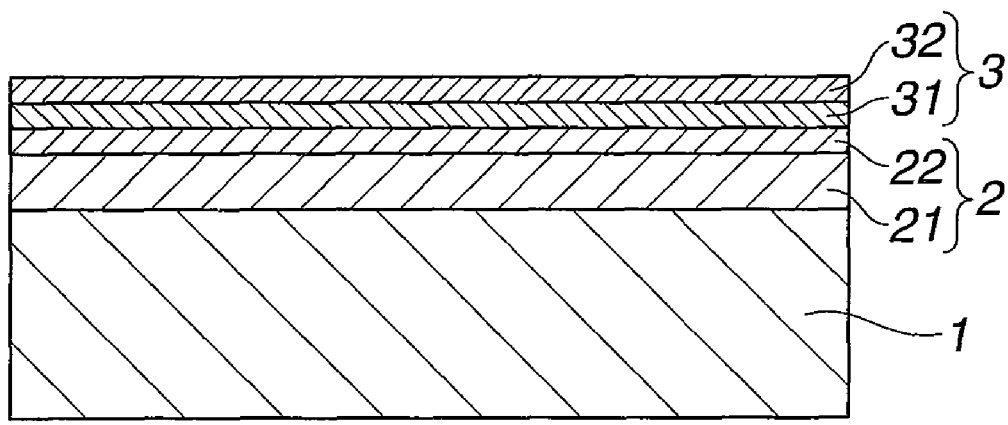
FIG. 2 is a cross-sectional view of a photomask blank in another embodiment of the invention.

In the embodiment illustrated in FIG. 1, the light-shielding film 2 is formed directly on the transparent substrate 1 and the etching mask film 3 is formed directly on the light-shielding film 2. The invention is not limited thereto as long as the etching mask film 3 which functions as an etching mask in processing of the light-shielding film 2 is disposed above the light-shielding film 2. For example, a film which is etched together with the light-shielding film 2 while the etching mask film 3 serving as an etching mask may be formed between the light-shielding film 2 and the etching mask film 3. Also included is a structure as shown in FIG. 2 in which a light-shielding film 2 consisting of a light-shielding function layer 21 and an antireflecting function layer 22 is formed on a transparent substrate 1 and an etching mask film 3 is formed on the light-shielding film 2.

The etching mask film used herein is composed of a chromium compound base material and deposited by reactive sputtering. With respect to the deposition of a chromium compound film by sputtering, a number of examples and conditions are known. For example, a film is deposited by reactive sputtering a target of metallic chromium or the like as described in JP-A 2007-241060. A chromium compound film is given a different stress depending on the amount of light elements entrained as film constituents during deposition. For example, when a film having a high chromium content, typically a metallic chromium film is deposited, it is given a tensile stress. As the light element content increases, the stress shifts toward compression side. Particularly when oxygen which is readily introduced in a high concentration is present, a film having a higher compression stress may be produced. Then an oxygen-containing chromium compound is preferred as the material imparting compression stress.

On the other hand, in order that the etching mask film provide sufficient etching resistance even in thin film form, a relatively high chromium content is preferred. At least a portion of the etching mask film should preferably have a chromium content of at least 50 mol %. In order that the etching mask film meet both its essential object and a low stress, a composite film, that is, an etching mask film of multilayer structure is used rather than a single material layer.

In the practice of the invention, the etching mask film may be a compositionally graded film which is a single layer whose composition is graded in thickness direction. As used herein, the multilayer film includes a collection of numerous layers of different composition when a compositionally graded film is microscopically viewed. The compositionally graded film should include a first composition which imparts a compression stress when deposited on the transparent substrate as a single composition layer and a second composition which imparts a tensile stress when deposited on the transparent substrate as a single composition layer, disposed in thickness direction. When the etching mask film is composed of a finite number of layers, it is preferred for deposition efficiency that the number of layers be 5 or less, because the number of layers is reflected by the number of steps of deposition under different conditions.

The etching mask film includes, in combination, a first layer of a material which imparts a compression stress when deposited on the transparent substrate as a single composition layer and a second layer of a material which imparts a tensile stress when deposited on the transparent substrate as a single composition layer. For example, the etching mask film may consist of multiple layers including, in combination, a layer containing oxygen or oxygen and nitrogen and having a relatively high content of such light elements (oxygen and nitrogen) as the first layer which imparts a compression stress when deposited as a single composition layer and a layer having a relatively high content of metallic chromium as the second layer which imparts a tensile stress when deposited as a single composition layer.

Examples of the chromium compound material include chromium oxide, chromium nitride, chromium carbide, chromium oxynitride, chromium oxycarbide, chromium nitride carbide, and chromium oxide nitride carbide. Each layer has a stress which may vary with the power applied to the target, the substrate temperature and the like during sputtering (see JP-A 2006-195202). Usually materials containing up to 60 mol % of chromium, and the balance of oxygen or oxygen and nitrogen, and optionally carbon (e.g., chromium oxide, chromium oxynitride, chromium nitride carbide and chromium oxide nitride carbide) impart compression stress. Chromium compound materials having a chromium content of 80 mol % to less than 100 mol % impart tensile stress.

The chromium compound base material that imparts compression stress is preferably composed of 30 to 60 atom % of chromium, 10 to 60 atom %, especially 20 to 40 atom % of oxygen, 0 to 60 atom %, especially 0 to 30 atom % of nitrogen, and 0 to 60 atom % of carbon.

The chromium compound base material that imparts tensile stress is preferably composed of at least 80 atom % of chromium, up to 60 atom %, especially up to 20 atom % of oxygen, up to 60 atom %, especially up to 30 atom % of nitrogen, and up to 60 atom %, especially up to 10 atom % of carbon.

Sputtering conditions are not particularly limited. Usually, the sputtering process uses a chromium target, argon or another rare gas as the sputtering gas, $O_2$ or oxygen-containing gas as the oxygen source, and $N_2$ or nitrogen-containing gas as the nitrogen source. The input power and the flow rates of the gases are adjusted so as to provide the desired composition.

It is preferred from the aspect of pattern dependence during etching that the etching mask film formed of the chromium compound base material have an overall thickness of at least 2 nm, and also preferably up to 20 nm, and more preferably up to 15 nm.

Since the magnitude (absolute value) of stress varies with sputtering conditions, the thickness and the combination of compositions or graded composition of a film may be determined by taking into account both the composition of chromium compound used and sputtering conditions.

In the photomask blank having an etching mask film of the chromium base material thus deposited, the etching mask film has a low stress due to the combination of tensile stress-imparting material with compression stress-imparting material. The following procedure may be used to determine whether or not the stress of the etching mask film falls in the desired range to provide an accuracy enough for use as a mask in double patterning.

In a simple mode, the conventional stress concept is applicable. The stress may be determined by comparing surface topography before and after deposition of an etching mask film, determining a change of surface topography resulting from film deposition, and speculating the stress of the etching mask film therefrom. However, because of the working history that the light-shielding film has undergone during its deposition and the working history that the etching mask film has undergone during heat treatment after its deposition, the deformation by film deposition may not be completely restored to the original when the films are removed. On the other hand, when the overall process including forming a resist pattern on the etching mask film, performing necessary processing, and finally removing the etching mask film in entirety is considered, what is necessary to maintain processing accuracy is that the surface topography is not deformed by removal of the etching mask film rather than that the surface topography is not deformed by deposition of the etching mask film.

Therefore, whether or not the stress of the etching mask film falls in the desired range is preferably determined by providing a photomask blank having an etching mask film deposited thereon, removing the etching mask film therefrom, comparing surface topography before and after removal of the etching mask film, and evaluating a change of surface topography as a warpage change. This evaluation may be performed by any method capable of detecting a warpage change, for example, by the following method.

Subject to analysis are the outermost surface of a photomask blank prior to removal of the etching mask film and the outermost surface of a treated substrate after removal of the entire etching mask film from the photomask blank.

(1) The outermost surfaces are measured by the surface topography measuring device, obtaining XYZ three-dimensional coordinate data of each outermost surface.

(2) From the coordinate data of each outermost surface, a least square plane of that outermost surface is computed.

(3) While the relative position between the coordinates of the outermost surface of the photomask blank and the least square plane thereof, and the relative position between the coordinates of the outermost surface of the treated substrate and the least square plane thereof are fixed, the coordinates and the least square plane are arranged such that (i) two least square planes are positioned on XY plane of a XYZ three-dimensional imaginary space, (ii) both the center of an outermost equivalent region of the photomask blank providing the former least square plane and the center of an outermost equivalent region of the treated substrate providing the latter least square plane are positioned at the origin, and (iii) the two outermost equivalent regions are arranged in overlay with their diagonal directions in alignment so that the four corners of the two outermost equivalent regions correspond to each other, respectively, before and after removal of the etching mask film.

(4) Within the range of the coordinate data arranged as above, for each pair of coordinates between the coordinates of the outermost surface of the photomask blank and the coordinates of the outermost surface of the treated substrate that are commensurate in X and Y values, the difference $(Z_1-Z_2)$ between a Z value $(Z_1)$ of the outermost surface of the photomask blank and a Z value $(Z_2)$ of the outermost surface of the treated substrate is computed.

(5) A sum of the magnitude of maximum and the magnitude of minimum of the difference $(Z_1-Z_2)$ of Z values is determined, that represents a warpage change.

More specifically, the surface topography of the outermost surface of the photomask blank prior to removal of the etching mask film (i.e., the surface of the etching mask film) is measured by a surface topography measuring device using an optical system. The device delivers XYZ three-dimensional coordinate data of the outermost surface to create a surface map, from which a least square plane is computed. Next, the entire etching mask film of chromium material is removed typically under the stripping conditions used in its processing. The surface topography of the outermost surface of the treated substrate after removal of the etching mask film (i.e., the surface of the light-shielding film or another film disposed contiguous to the etching mask film) is similarly measured. The device delivers XYZ three-dimensional coordinate data of that outermost surface to create a surface map, from which a least square plane is computed.

Next, using a suitable unit, typically a computer, the coordinates and the least square planes thus obtained are arranged in an imaginary space so as to meet all the following conditions (i) to (iii), while the relative position between the coordinates of the outermost surface of the photomask blank and the least square plane thereof, and the relative position between the coordinates of the outermost surface of the treated substrate and the least square plane thereof are fixed (i.e., the coordinates of the outermost surface and the least square plane providing them are integrated).

(i) Two least square planes are positioned on XY plane of a XYZ three-dimensional imaginary space.
(ii) Both the center of an outermost equivalent region of the photomask blank providing the former least square plane and the center of an outermost equivalent region of the treated substrate providing the latter least square plane are positioned at the origin.
(iii) The two outermost equivalent regions are arranged in overlay with their diagonal directions in alignment so that the four corners of the two outermost equivalent regions correspond to each other, respectively, before and after removal of the etching mask film.

Figure 3A:
FIG. 3 illustrates, for a photomask blank having an etching mask film deposited on a substrate and the treated substrate after removal of the etching mask film, how to evaluate a change of surface topography before and after removal of the etching mask film.
Figure 3B:
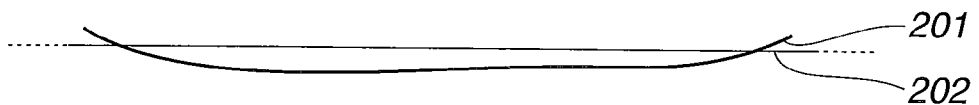
Figure 3C:
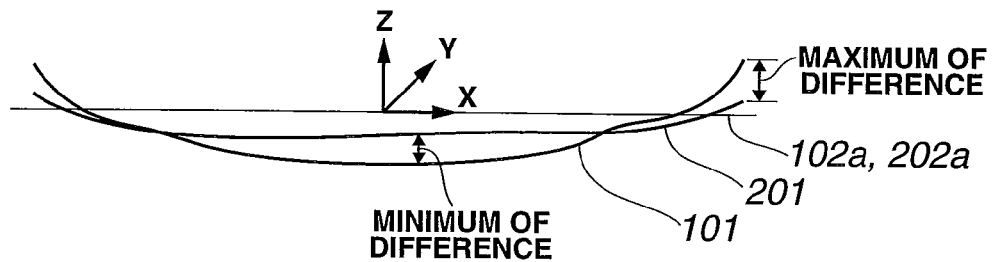

The foregoing procedure is described with reference to FIG. 3. A coordinate group 101 of the outermost surface of a photomask blank and a least square plane 102 thereof as shown in FIG. 3A, and a coordinate group 201 of the outermost surface of a treated substrate and a least square plane 202 thereof as shown in FIG. 3B are arranged in a XYZ three-dimensional imaginary space as shown in FIG. 3C. The least square planes 102 and 202 are arranged on XY plane, so that both the planes are positioned in a common plane. Both an outermost equivalent region 102a of the photomask blank providing least square plane 102 and an outermost equivalent region 202a of the treated substrate providing the least square plane 202 are arranged such that their centers are positioned at the origin of XYZ coordinates. That is, least square planes 102 and 202 are arranged in XY plane with Z=0. Further the two outermost equivalent regions are arranged in overlay with their diagonal directions in alignment so that four corners of the outermost equivalent region 102a correspond to four corners of the outermost equivalent region 202a, respectively, (one corner corresponds to relevant one corner) before and after removal of the etching mask film.

Next, as shown in FIG. 3C, within the range of the coordinate data arranged as above, for each pair of coordinates between the coordinates of the outermost surface of the photomask blank and the coordinates of the outermost surface of the treated substrate that are commensurate in X and Y values, the difference ($Z_1-Z_2$) between a Z value ($Z_1$) of the outermost surface of the photomask blank and a Z value ($Z_2$) of the outermost surface of the treated substrate is computed. The value of difference ($Z_1-Z_2$) is positive (+) if $Z_1>Z_2$, and negative (−) if $Z_1<Z_2$.

A sum of the magnitude (absolute value) of maximum and the magnitude of minimum of the difference ($Z_1-Z_2$) of Z values represents a warpage change.

For a photomask blank of 152 mm (6 inches) square, a warpage change of up to 50 nm indicates a processing accuracy with a latitude enough to be used in the double patterning version of lithography to form a pattern with a minimum line width of about 25 nm.

For photomask blanks of different dimensions, a permissible warpage change is in proportion to the dimensions. As long as the warpage change is up to 50 nm/L/152 mm wherein L is the length (in mm) of a longer side of a transparent substrate, a high processing accuracy is available.

Briefly stated, coordinate data are applicable to both the outermost surface of a photomask blank and the outermost surface of a treated substrate, from which a least square plane of the surface may be computed in a simplified way. Three or more points are set on a circle having a radius R (mm) about the center of each outermost surface. Least square planes are computed from the coordinates of the three or more points and the centers. Thereafter, a warpage change may be similarly evaluated. If the value of warpage change is less than or equal to:

$$50\ (nm)/2R/(152\ (mm) \times \sqrt{2}),$$

then a high processing accuracy is achievable.

In the above inspection of the stress range, any of well-known methods for etching chromium base material films may be used in stripping the etching mask film in the form of a multilayer film of chromium base material. Preferably a method compliant with actual processing is used. Specifically dry etching with oxygen-containing chlorine etchant gas is preferred.

In the photomask blank of the invention, the light-shielding film of an optionally transition metal-containing silicon compound may be any of well-known light-shielding films. For example, it may be a film of an optionally transition metal-containing silicon compound as described in JP-A 2003-50458. The light-shielding film preferably has a multilayer structure. The light-shielding film of multilayer structure preferably includes an antireflecting function layer and a light-shielding layer.

The optionally transition metal-containing silicon base materials of which the light-shielding layer and antireflection layer of the light-shielding film are made comprises silicon alone, and silicon compounds containing silicon and at least one element selected from oxygen, nitrogen and carbon, and optionally containing a transition metal. Examples of the silicon compound include silicon oxide, silicon nitride, silicon oxynitride, silicon oxycarbide, silicon nitride carbide, and silicon oxide nitride carbide, and the foregoing compounds further containing a transition metal. Inclusion of a transition metal is preferred because a least defective film can be deposited and better optical properties are available. The transition metal used herein is preferably at least one of titanium, vanadium, cobalt, nickel, zirconium, niobium, molybdenum, hafnium, tantalum and tungsten, with molybdenum being more preferred for ease of dry etching. The light-shielding layer and antireflection layer each may consist of a single layer, multiple layers, or a layer whose composition is graded in thickness direction.

In the case of light-shielding layer, the optionally transition metal-containing silicon material may preferably be composed of 10 atom % to 95 atom %, especially 30 atom % to 95 atom % of silicon, 0 atom % to 50 atom %, especially 0 atom % to 30 atom % of oxygen, 0 atom % to 40 atom %, especially 1 atom % to 20 atom % of nitrogen, 0 atom % to 20 atom %, especially 0 atom % to 5 atom % of carbon, and 0 atom % to 35 atom %, especially 1 atom % to 20 atom % of a transition metal.

Where the light-shielding layer is compositionally graded in thickness direction, the material may preferably be composed of 10 atom % to 95 atom %, especially 15 atom % to 95 atom % of silicon, 0 atom % to 60 atom %, especially 0 atom % to 30 atom % of oxygen, 0 atom % to 57 atom %, especially 1 atom % to 40 atom % of nitrogen, 0 atom % to 30 atom %, especially 0 atom % to 20 atom % of carbon, and 0 atom % to 35 atom %, especially 1 atom % to 20 atom % of a transition metal.

In the case of antireflection layer, the optionally transition metal-containing silicon material may preferably be composed of 10 atom % to 80 atom %, especially 30 atom % to 50 atom % of silicon, 0 atom % to 60 atom %, especially 0 atom % to 40 atom % of oxygen, 0 atom % to 57 atom %, especially 20 atom % to 50 atom % of nitrogen, 0 atom % to 20 atom %, especially 0 atom % to 5 atom % of carbon, and 0 atom % to 35 atom %, especially 1 atom % to 20 atom % of a transition metal.

Where the antireflection layer is compositionally graded in thickness direction, the material may preferably be composed of 0 atom % to 90 atom %, especially 10 atom % to 90 atom % of silicon, 0 atom % to 67 atom %, especially 5 atom % to 67 atom % of oxygen, 0 atom % to 57 atom %, especially 5 atom % to 50 atom % of nitrogen, 0 atom % to 20 atom %, especially 0 atom % to 5 atom % of carbon, and 0 atom % to 95 atom %, especially 1 atom % to 20 atom % of a transition metal.

The antireflection layer preferably has a nitrogen content of 5 atom % to 40 atom % because it is less damaged by dry etching with oxygen-containing chlorine etchant gas used in etching away of the etching mask film of chromium base material. A ratio of transition metal to silicon may range from 1:1 to 1:10 on atomic basis.

The method commonly used to form a film containing a transition metal and silicon is by using a target containing silicon and a transition metal in a preselected ratio alone or by selecting two or more from a silicon target, a transition metal target and a target of silicon and transition metal (transition metal silicide target), and adjusting the sputtering areas of the targets, or by using a plurality of targets and adjusting the powers applied to the targets, thereby depositing silicon and transition metal in a desired ratio. Where light elements such as oxygen, nitrogen and carbon are contained, oxygen, nitrogen or carbon-containing gas may be introduced as a reactive gas into the sputtering gas whereby the desired film may be deposited by reactive sputtering.

In one embodiment the photomask blank having the light-shielding film is for binary mask, and in another embodiment the photomask blank having the light-shielding film is a halftone phase shift mask blank having a halftone phase shift film below the light-shielding film. The thickness of the light-shielding film is determined such that the light-shielding film itself in the one embodiment or the light-shielding film and halftone phase shift film combined in the other embodiment may have an optical density of at least 2, preferably 2.5 to 4. In general, if the light-shielding film becomes too thick, a lowering of processing accuracy arises from its relationship to etching resistance of a resist film. This problem is substantially eliminated where the etching mask film is provided as in the invention. Then the light-shielding film may be designed through a selection from the foregoing materials so that the reflectance at the exposure wavelength and inspection wavelength may not exceed 20%, insuring a high freedom of design.

In processing the photomask blank into a photomask, any of well-known methods may be used, for example, the method disclosed in JP-A 2002-229183.

For a binary mask, for example, the following method may be used. Provided is a photomask blank having a light-shielding film consisting of a light-shielding layer and an antireflection layer deposited on a transparent substrate and an etching mask film deposited on the light-shielding film. First a resist is coated on the photomask blank and patterned, after which the etching mask film is patterned by oxygen-containing chlorine dry etching. Next, the antireflection layer and the light-shielding layer are patterned by fluorine dry etching while the resist film and etching mask film serve as an etching mask. Thereafter, the resist film is stripped off, and the etching mask film is removed by oxygen-containing chlorine dry etching. This completes a photomask in which the antireflection layer of the light-shielding film is exposed on the surface.

EXAMPLE

Examples of the invention are given below by way of illustration and not by way of limitation.

Example 1

Using a DC sputtering system having two targets mounted therein, a light-shielding film of molybdenum, silicon and nitrogen was deposited to a thickness of 41 nm on a 6 inches (152 mm) square quartz substrate. Argon and nitrogen were fed as the sputtering gas so as to establish a gas pressure of 0.05 Pa in the chamber. Two targets were a Mo target as the transition metal source and a Si (single crystal) target as the silicon source. On ESCA analysis, the light-shielding film had a composition of Mo:Si:N=1:3:1.5 (atomic ratio).

Using a DC sputtering system having two targets mounted therein, an antireflection film of thickness direction graded composition of molybdenum, silicon and nitrogen was deposited to a thickness of 18 nm on the light-shielding film. Argon and nitrogen were fed as the sputtering gas so as to establish a gas pressure of 0.05 Pa in the chamber. Two targets were a Mo target as the transition metal source and a Si (single crystal) target as the silicon source. The substrate was rotated at 30 rpm. On ESCA analysis, the antireflection film had a composition of Mo:Si:N=1:3:1.5 (atomic ratio) on the light-shielding film side and a composition of Mo:Si:N=1:5:5 (atomic ratio) on the side remote from the transparent substrate (the etching mask film side).

Next, using a DC sputtering system, an etching mask layer of CrN was deposited to a thickness of 7 nm on the antireflection film. Argon and nitrogen were fed as the sputtering gas so as to establish a gas pressure of 0.05 Pa in the chamber. A Cr target was used. The substrate was rotated at 30 rpm. On ESCA analysis, the etching mask layer had a composition of Cr:N=9:1 (atomic ratio).

Next, using a sputtering system, an etching mask layer of CrON was deposited to a thickness of 3 nm on the etching mask layer of CrN. Argon and nitrogen were fed as the sputtering gas so as to establish a gas pressure of 0.05 Pa in the chamber. A Cr target was used. The substrate was rotated at 30 rpm. On ESCA analysis, the etching mask layer had a composition of Cr:N:O=5.5:2:2.5 (atomic ratio). A photomask blank was completed in this way.

A surface topography of the photomask blank having an etching mask film was measured by an optical surface topography analyzing system Tropel UltraFlat® (Corning Tropel Corp.), obtaining surface topography data.

Next, the photomask blank was subjected to chlorine dry etching under conditions: 185 sccm of $Cl_2$, 55 sccm of $O_2$, and 9.25 sccm of He. Only the etching mask film was selectively removed.

A surface topography of the treated substrate after removal of the etching mask film was similarly measured. A change of surface topography before and after removal of the etching mask film was evaluated in accordance with the steps (1) to (5) to compute a warpage change. A warpage change of 46 nm was determined.

Comparative Example 1

Using a DC sputtering system having two targets mounted therein, a light-shielding film of molybdenum, silicon and nitrogen was deposited to a thickness of 41 nm on a 6 inches (152 mm) square quartz substrate. Argon and nitrogen were fed as the sputtering gas so as to establish a gas pressure of 0.05 Pa in the chamber. Two targets were a Mo target as the transition metal source and a Si (single crystal) target as the silicon source. On ESCA analysis, the light-shielding film had a composition of Mo:Si:N=1:3:1.5 (atomic ratio).

Using a DC sputtering system having two targets mounted therein, an antireflection film of thickness direction graded composition of molybdenum, silicon and nitrogen was deposited to a thickness of 18 nm on the light-shielding film. Argon and nitrogen were fed as the sputtering gas so as to establish a gas pressure of 0.05 Pa in the chamber. Two targets were a Mo target as the transition metal source and a Si (single crystal) target as the silicon source. The substrate was rotated at 30 rpm. On ESCA analysis, the antireflection film had a composition of Mo:Si:N=1:3:1.5 (atomic ratio) on the light-shielding film side and a composition of Mo:Si:N=1:5:5 (atomic ratio) on the side remote from the transparent substrate (the etching mask film side).

Next, using a DC sputtering system, an etching mask film of CrN was deposited to a thickness of 10 nm on the antireflection film. Argon and nitrogen were fed as the sputtering gas so as to establish a gas pressure of 0.05 Pa in the chamber. A Cr target was used. The substrate was rotated at 30 rpm. On ESCA analysis, the etching mask layer had a composition of Cr:N=9:1 (atomic ratio). A photomask blank was completed in this way.

A surface topography of the photomask blank having an etching mask film was measured as in Example 1, obtaining surface topography data.

Next, the etching mask film was selectively removed from the photomask blank by dry etching as in Example 1.

A surface topography of the treated substrate after removal of the etching mask film was similarly measured. A change of surface topography before and after removal of the etching mask film was evaluated in accordance with the steps (1) to (5) to compute a warpage change. A warpage change of 113 nm was determined.

Japanese Patent Application No. 2009-086145 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photomask blank comprising a rectangular transparent substrate, a light-shielding film of an optionally transition metal-containing silicon material deposited thereon, and an etching mask film of a chromium compound base material deposited on the light-shielding film for enabling precise processing of the light-shielding film, said etching mask film being to be entirely stripped in any step until the photomask blank is processed into a photomask, wherein said etching mask film consists of multiple layers of different composition which are deposited by reactive sputtering, the multiple layers including, in combination, a first layer of a material which imparts a compression stress when deposited on the substrate as a single composition layer and a second layer of a material which imparts a tensile stress when deposited on the substrate as a single composition layer.

2. The photomask blank of claim 1 wherein the material which imparts a compression stress is an oxygen-containing chromium compound.

3. The photomask blank of claim 1 wherein when a warpage change is determined by
   (1) measuring each of the outermost surface of the photomask blank prior to removal of the etching mask film and the outermost surface of the treated substrate after removal of the entire etching mask film, by a surface topography measuring device, obtaining XYZ three-dimensional coordinate data of each outermost surface,
   (2) computing a least square plane of each outermost surface from the coordinate data of each outermost surface,
   (3) while the relative position between the coordinates of the outermost surface of the photomask blank and the least square plane thereof, and the relative position between the coordinates of the outermost surface of the treated substrate and the least square plane thereof are fixed, arranging the coordinates and the least square plane such that
   (i) two least square planes are positioned on XY plane of a XYZ three-dimensional imaginary space,
   (ii) both the center of an outermost equivalent region of the photomask blank providing the former least square plane and the center of an outermost equivalent region of the treated substrate providing the latter least square plane are positioned at the origin, and
   (iii) the two outermost equivalent regions are arranged in overlay with their diagonal directions in alignment so that the four corners of the two outermost equivalent regions correspond to each other, respectively, before and after removal of the etching mask film,
   (4) within the range of the coordinate data arranged as above, for each pair of coordinates between the coordinates of the outermost surface of the photomask blank and the coordinates of the outermost surface of the treated substrate that are coincident in X and Y values, computing the difference $(Z_1-Z_2)$ between a Z value $(Z_1)$ of the outermost surface of the photomask blank and a Z value $(Z_2)$ of the outermost surface of the treated substrate, and
   (5) determining a sum of the magnitude of maximum and the magnitude of minimum of the difference $(Z_1-Z_2)$ of Z values that represents a warpage change,
   the warpage change is up to 50 nm/L/152 nm wherein L is the length (in mm) of a longer side of the transparent substrate.

4. A photomask fabricated from the photomask blank of claim 1.

* * * * *